United States Patent
Yu et al.

(10) Patent No.: US 11,955,369 B2
(45) Date of Patent: Apr. 9, 2024

(54) RECESSED LOCAL INTERCONNECT FORMED OVER SELF-ALIGNED DOUBLE DIFFUSION BREAK

(71) Applicant: International Business Machines Corporation, Armonk, NY (US)

(72) Inventors: Lan Yu, Voorheesville, NY (US); Chen Zhang, Guilderland, NY (US); Huimei Zhou, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 17/341,640

(22) Filed: Jun. 8, 2021

(65) Prior Publication Data
US 2022/0392797 A1   Dec. 8, 2022

(51) Int. Cl.
*H01L 29/66* (2006.01)
*H01L 21/74* (2006.01)
*H01L 21/8234* (2006.01)
*H01L 23/535* (2006.01)
*H01L 27/088* (2006.01)

(52) U.S. Cl.
CPC .... *H01L 21/743* (2013.01); *H01L 21/823475* (2013.01); *H01L 21/823481* (2013.01); *H01L 23/535* (2013.01); *H01L 27/0886* (2013.01)

(58) Field of Classification Search
None
See application file for complete search history.

(56) References Cited

U.S. PATENT DOCUMENTS

| | | |
|---|---|---|
| 9,362,181 B1 | 6/2016 | Xie |
| 9,412,616 B1 | 8/2016 | Xie |
| 9,437,588 B1 | 9/2016 | Zeng |
| 9,831,272 B2 | 11/2017 | Chen |
| 9,865,704 B2 | 1/2018 | Xie |
| 9,960,231 B2 | 5/2018 | Chen |
| 9,984,932 B1 | 5/2018 | Zang |
| 10,083,964 B1 | 9/2018 | Reznicek |
| 2013/0316514 A1* | 11/2013 | Kim ............... H01L 29/7848 438/424 |
| 2016/0163604 A1* | 6/2016 | Xie ................. H01L 21/845 438/430 |
| 2018/0183414 A1 | 6/2018 | Guo |
| 2018/0240885 A1 | 8/2018 | Neogi |

FOREIGN PATENT DOCUMENTS

CA        3024332 A1    12/2017

* cited by examiner

*Primary Examiner* — Joseph C. Nicely
*Assistant Examiner* — Lamont B Koo
(74) *Attorney, Agent, or Firm* — Monchai Chuaychoo (57) ABSTRACT

An approach for creating a buried local interconnect around a DDB (double diffusion break) to reduce parasitic capacitance on a semiconductor device is disclosed. The approach utilizes a metal, as the local interconnect, buried in a cavity around the DDB region of a semiconductor substrate. The metal is disposed by two dielectric layers and the substrate. The two dielectric layers are recessed beneath two gate spacers. The buried local interconnect is recessed into the cavity where the top surface of the interconnect is situated below the top surface of the surrounding S/D (source/drain) epi (epitaxy). The metal of the local interconnect can be made from W, Ru or Co.

8 Claims, 14 Drawing Sheets

FIG. 1A *(PRIOR ART)* VIEW Y-Y

ND LOCAL INTERCONNECT
RECESSED LOCAL INTERCONNECT FORMED OVER SELF-ALIGNED DOUBLE DIFFUSION BREAK

BACKGROUND

The present invention relates generally manufacturing of integrated circuit devices, and more particularly to local interconnect formation over the double diffusion breaks region.

The myriad transistor devices that are formed as part of an IC (integrated circuit) product must be electrically isolated from one another to properly function in an electrical circuit. Normally, this is accomplished by forming a "trench" in the substrate and filling the "trench" with an insulating material (i.e., silicon dioxide). These isolation regions/trench can be referred to as "diffusion break".

An individual transistor of an IC may be isolated (electrically) from other transistors using a single diffusion break (SDB), which may occupy a single dummy gate. Or an individual transistor may rely on using a double diffusion break (DDB). The SDB may have smaller footprint (e.g., an SDB may be about 20 nm wide versus a double diffusion break (DDB).

SUMMARY

Aspects of the present invention disclose a device, computer-implemented method, a computer system and computer program product for a buried local interconnect on a semiconductor device. The device may include, a substrate comprising one or more gates, one or more gate spacers and one or more s/d (source/drain) epis; a double diffusion break located between a first gate and a second of the one or more gates on the substrate; a plurality of dielectric liner disposed at a bottom portion of the double diffusion break; a local interconnect disposed on the plurality of dielectric liner and a thin adhesion liner; and a dielectric fill material disposed on the local interconnect.

The computer implemented method for forming a buried local interconnect in a semiconductor device may be implemented by one or more computer processors and may include, forming one or more gates, one or more gate spacers and one or more S/D (source/drain) epis (epitaxies) on a substrate; etching a first unwanted epis from the one or more S/D epis; etching to form a cavity in a double diffusion break region of the substrate; forming a plurality of dielectric liners in the cavity; forming a local interconnect on top of the plurality of dielectric liners; and forming an ILD (interlayer dielectric) layer over the local interconnect.

According to another embodiment of the present invention, there is provided a computer system. The computer system comprises a processing unit; and a memory coupled to the processing unit and storing instructions thereon. The instructions, when executed by the processing unit, perform acts of the method according to the embodiment of the present invention.

BRIEF DESCRIPTION OF THE DRAWINGS

Preferred embodiments of the present invention will now be described, by way of example only, with reference to the following drawings, in which.

DETAILED DESCRIPTION

In the current state of art of IC (integrated circuits) devices, specifically the use of a DDB (double diffusion break) has been primary utilize to isolate transistors from another in IC Furthermore, the use of local interconnects between DDB helps with routing flexibility and is widely utilized in the industry. However, there are two main issues with the use of local interconnects between DDB: (i) as the gate pitch scales, the gate alignment at Fin edge (of FinFET) becomes increasing difficult and (ii) a large parasitic capacitance between the local interconnect and the dummy gate, which slows down the circuit.

Figure 1A:
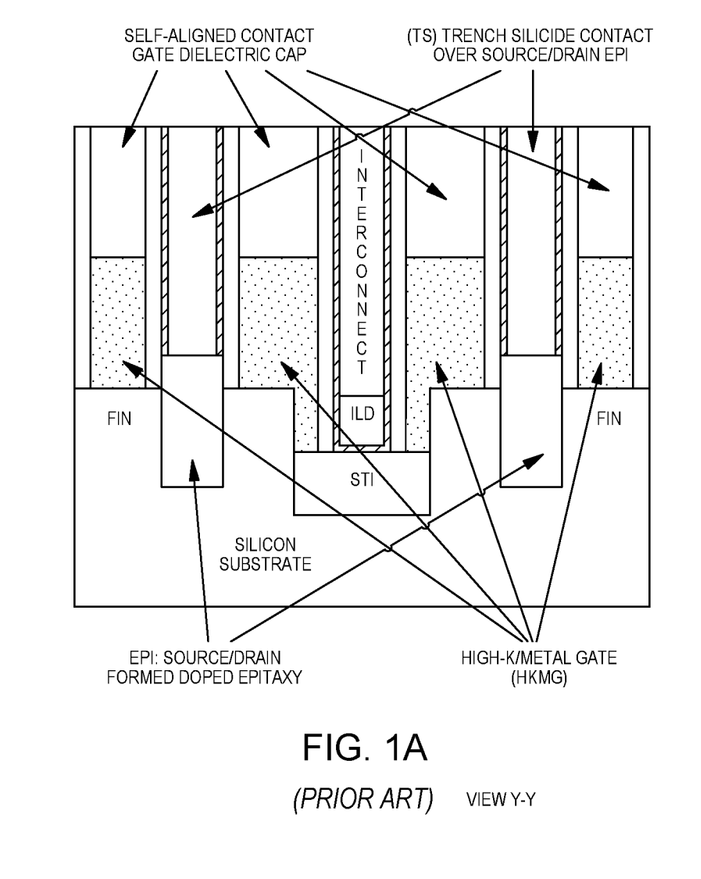
FIG. 1A and FIG. 1B illustrate a local interconnect located in a (DDB) double diffusion break area (prior art)
Figure 1B:
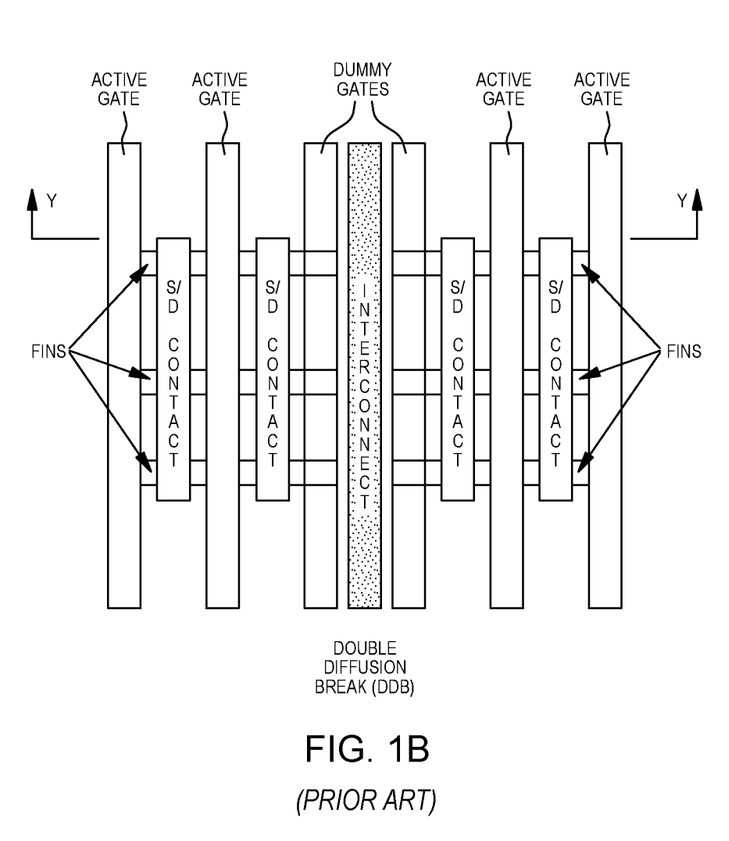

FIG. 1A and FIG. 1B show the prior art for utilizing interconnects around double diffusion breaks. FIG. 1A shows a FinFET device from a side profile perspective and FIG. 1B shows a different perspective.

Figure 2:
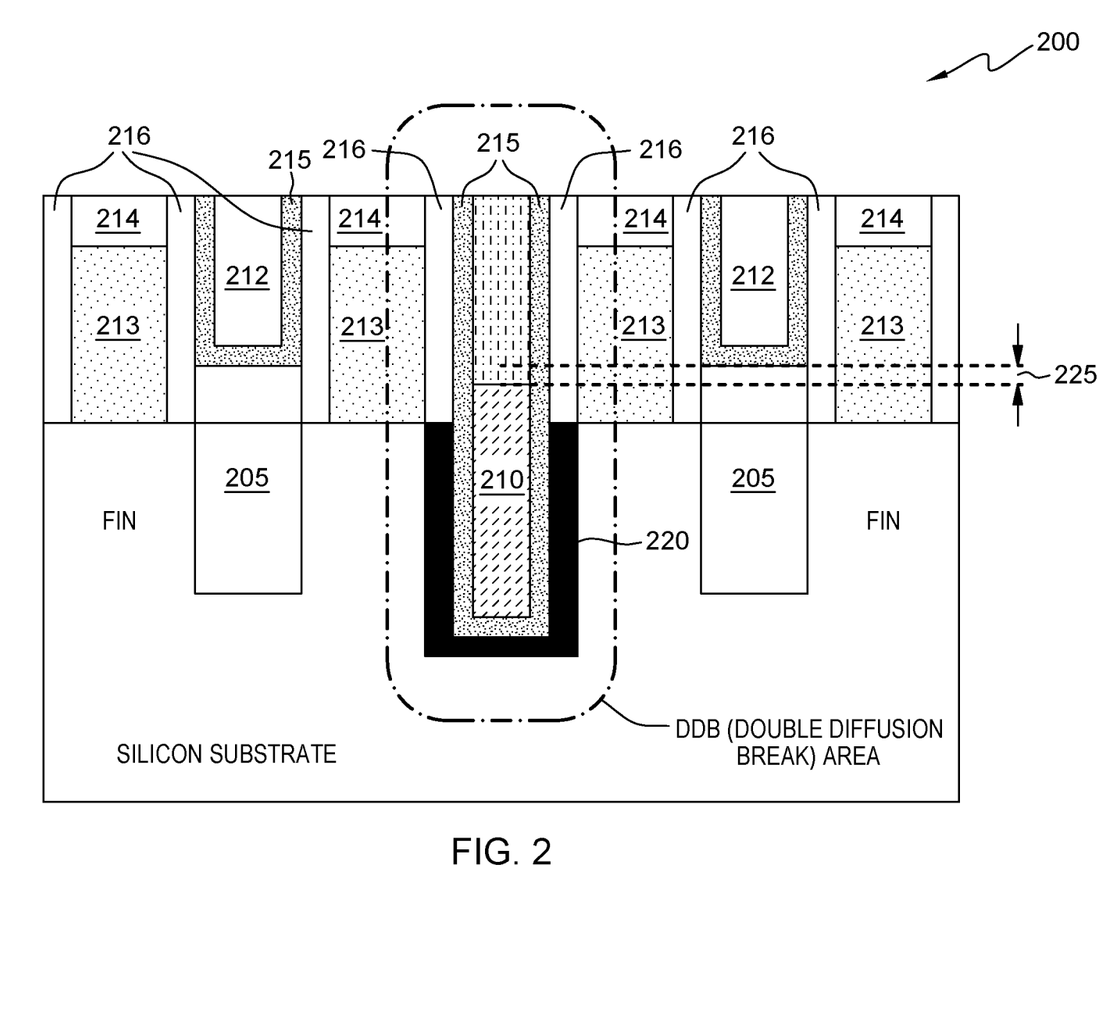
FIG. 2 is a depiction of a recessed local interconnect in a double diffusion break area, designated as recessed interconnect DDB 200, in accordance with an embodiment of the present invention.

Embodiments of the present invention recognizes the deficiencies in the current state of art and provides an approach for addressing the deficiencies. One approach leverages the use of a buried (i.e., recessed) local interconnect between DDB to reduce parasitic capacitance. The local interconnect is "buried" into the silicon substrate (refer to height difference 225 of FIG. 2). For example, the top surface of the buried interconnect is slightly below the top surface of epi 205 of FIG. 2 (i.e., source/drain formed by selective in-situ doped epitaxy). FIG. 2 will discuss in greater details on the structures of the buried local interconnect.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

It should be understood that the Figures are merely schematic and are not drawn to scale. It should also be understood that the same reference numerals are used throughout the Figures to indicate the same or similar parts.

Structural Features

FIG. 2 is a depiction of a recessed local interconnect in a double diffusion break area, designated as recessed interconnect DDB 200, in accordance with an embodiment of the present invention.

A finFET device is shown to illustrate an embodiment of the present invention. Any other semiconductor devices (e.g., nanowire device, nanosheet device, planar device, etc.) that leverages the use of DDB can benefit from the approach of the current embodiment. Referring to FIG. 2, a finFET device is shown with buried interconnect. Some of the general structures includes, but it is not limited to the following: (i) silicon substrate; (ii) fins; (iii) epi 205, source/drain formed by selective in-situ doped epitaxy; (iv) buried interconnect 210; (v) TS 212 (trench silicide contact over source/drain epi); (vi) high-k/metal gate 213; (vii) sac cap 214; (viii) second dielectric liner 215, (ix) gate spacers 216; (x) ILD 217, interlayer dielectric; (xi) first dielectric liner 220 and (xii) height difference 225.

Regarding buried interconnect 210, a metal such as, W, Ru, or Co, (with a thin adhesion liner such as TiN, TaN) can be used as the local interconnect at the DDB region. The top surface of buried interconnect 210 is lower than the top surface of the S/D epi (i.e., 205). Furthermore, buried interconnect 210 is capped with interlayer dielectric (ILD), refer to ILD 217 of FIG. 2. Additionally, buried interconnect 210 is isolated from the substrate with bi-layer dielectric liners. The dual layer liners includes 215 and 220. 220 is the 1st dielectric liner is formed directly over the Si substrate cavity, and its two ends are below the gate spacers (i.e., 216). The second dielectric liner (i.e., 215) is formed over the gate spacer and the 1st dielectric liner.

Manufacturing Features

Figure 3:
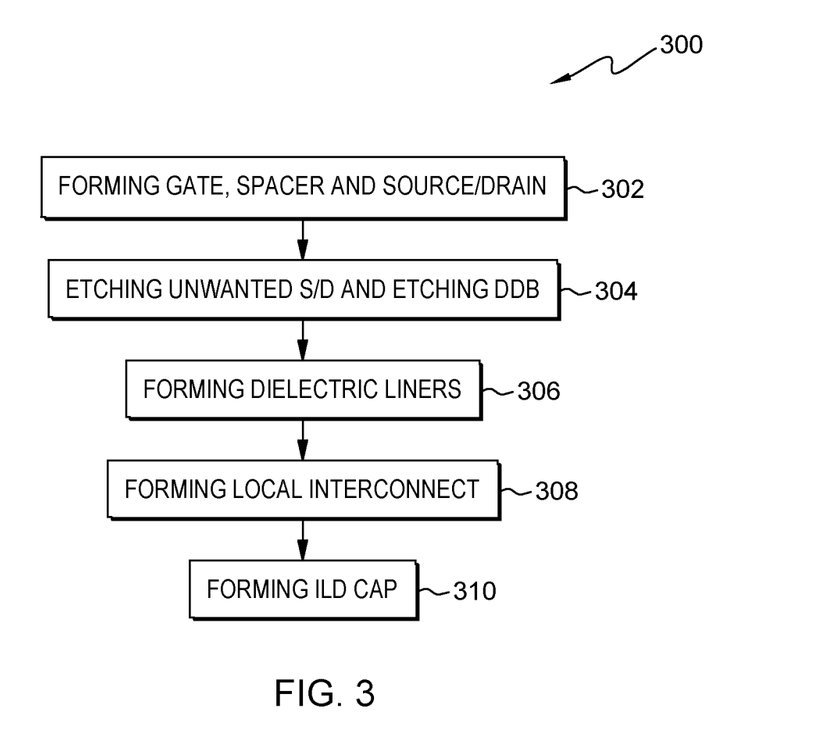
FIG. 3 illustrates a high level flowchart, designated as process 300, of the method in creating recessed interconnect DDB 200, in accordance with an embodiment of the present invention.

FIG. 3 illustrate a high level flowchart, designated as process 300, of the method in creating recessed interconnect DDB 200, in accordance with an embodiment of the present invention. Process 300, may include the following steps: (i) forming gates, spacers and S/D epis (step 302), (ii) etching unwanted S/D epis (step 304), (iii) forming dielectric liners (step 306), (iv) forming recessed local interconnect (step 308) and (v) forming ILD cap (step 310).

Process 300 begins with forming gates, spacers and S/D epis (step 302). Any known techniques in the art may be used to form those structures on a FinFET, such as, patterning, depositions, etching, etc. It would be beneficial to refer to FIG. 4A-FIG. 4J to help understand process 300.

Process 300 continues with etching unwanted/sacrificial materials and further etching into the substrate forming substrate cavities in double diffusion break region (step 304). Any known etching techniques in the art may be used, such as, RIE (reactive ion etching). Usually sacrificial material is some material that is purposely formed for some purpose later. It is noted that the unwanted materials can be considered a (first) sacrificial material since it will be removed later.

Process 300 continues with forming dielectric liners to isolate the exposed substrate in the cavity (step 306). It is noted that dielectric liners comprises of a first liner which directly forms over the substrate cavities with its ends below the gate spacers. The second dielectric liner which forms over the gate spacer and over the first dielectric liner. Any known techniques in the art may be used, such as, patterning, depositions, etching, etc.

Furthermore, as part of step 306, a second sacrificial material is deposited after forming the first dielectric liners. This second sacrificial material can be an OPL (organic planarization layer). It is noted that the second sacrificial material will be removed later.

Process 300 continues with forming a recessed local interconnect above the dielectric liners (step 308). The "recessed" local interconnects means that the top surface of the local interconnect is lower than the top surface of the S/D epi (refer to difference 225 of FIG. 2). Furthermore, the local interconnect can be made with metals, such as W, Ru, or Co and with a thin adhesion liner, such as, TiN, TaN. Any known techniques in the art may be used, such as, patterning, depositions, etching, etc. to form the local interconnects.

Process 300 continues with forming ILD cap (i.e., refer to ILD 217 of FIG. 2) over the recessed local interconnect (step 310). Any known techniques in the art may be used, such as, patterning, depositions, etching, etc. After forming ILD cap, there are several more steps that includes, (i) RMG (replacement metal gate), (ii) adding SAC cap 404 (self-aligned contact gate dielectric cap) and (iii) TS 402 (trench silicide contact over source/drain epi) formation. It is noted that, all dummy gates materials are removed, and are replaced with high-k/metal gate stacks.

Other embodiments, the process may include the following steps: (i) forming gates, spacers and epi, (ii) forming DDB which includes patterning and an isotropic Si etch, (iii) depositing a low-temp oxide (i.e., first dielectric liner 220) layer, (iv) filling with OPL (organic planarization layer) 401 and etching back, (v) depositing a second dielectric layer, (vi) filling the recessed local interconnect, (vii) depositing ILD layer and hard masks and (viii) forming ts, sac cap and replacing dummy gates.

Figure 4A:
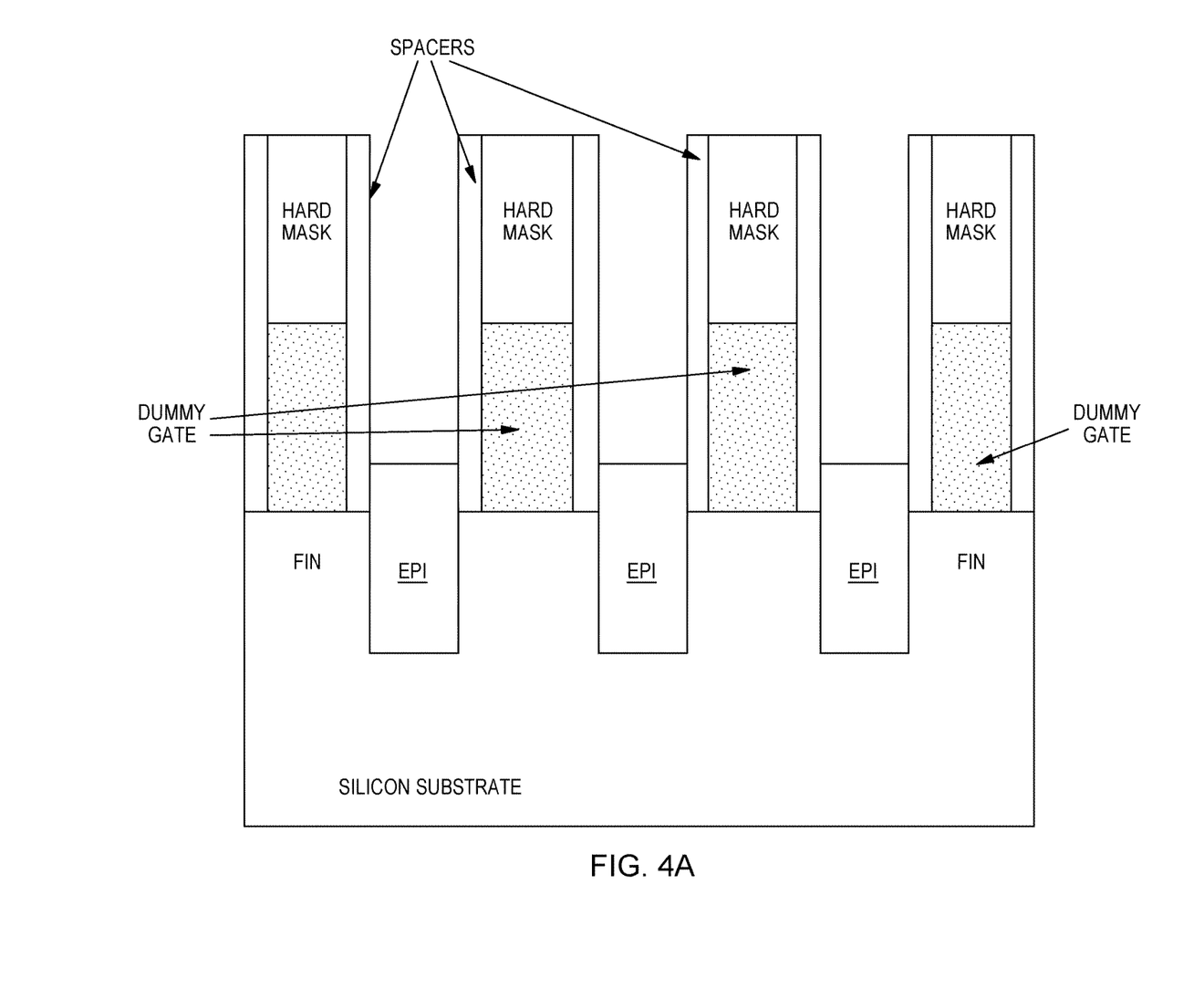
FIG. 4A through FIG. 4J illustrate the manufacturing steps in creating recessed interconnect DDB 200, in accordance with an embodiment of the present invention.

FIG. 4A-FIG. 4J illustrate process 300 and an alternative embodiment of process 300. FIG. 4A shows a device with the following structures already formed, gate, spacers and epi (source/drain formed by selective in-situ doped epitaxy). It is noted that dummy gates can be made with thin $SiO_2$ and Si material. Other structures show includes fins and hard masks.

Figure 4B:
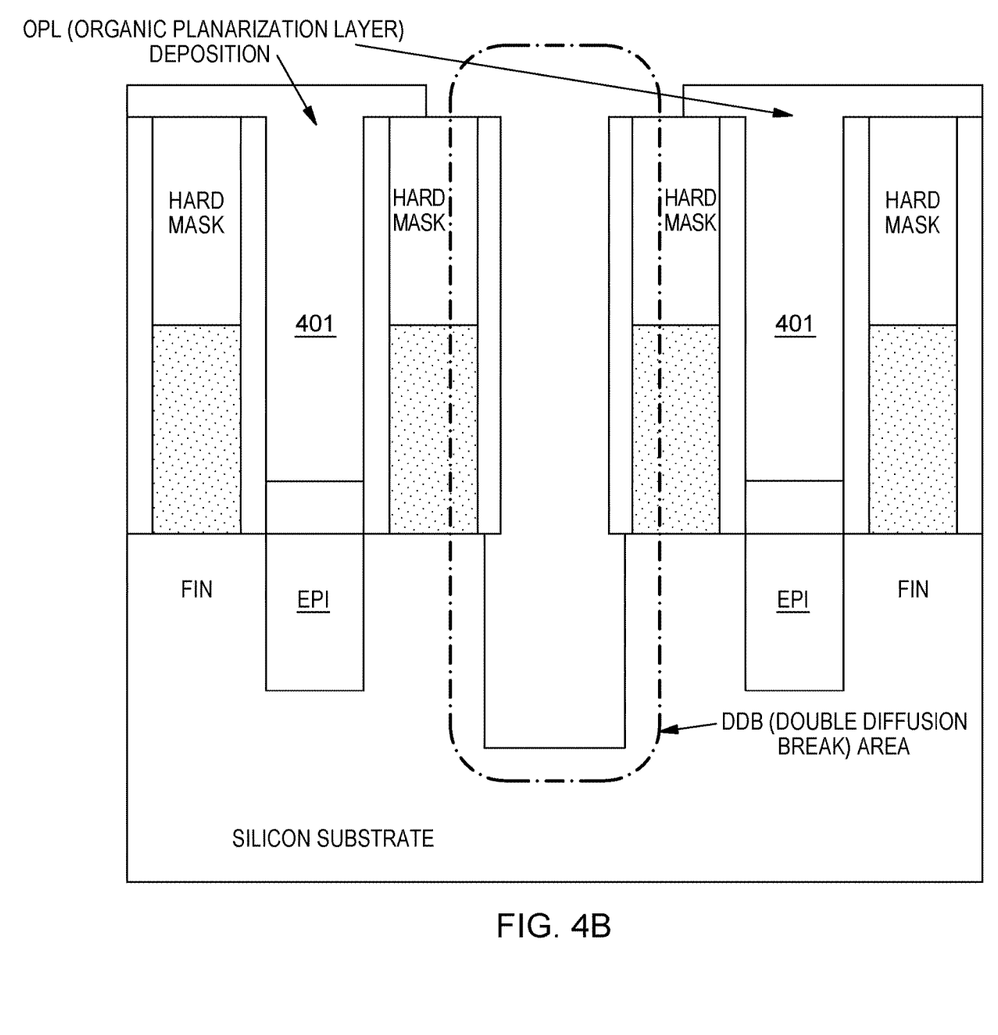

FIG. 4B shows forming DDB which includes litho patterning and a Si etch. At end of the Si etch, an isotropic Si etch can be used to form a bit Si lateral undercut. An OPL 401, is deposited over the epi and hard mask. It is noted that in this Figure, a cavity is formed where one of the epi material used to exist.

The S/D epi growth is everywhere simply because epi will grow from the exposed semiconductor surface, and is not considered as a sacrificial material. It is noted that even S/D epi is not grown at double diffusion break region, the process still works.

Figure 4C:
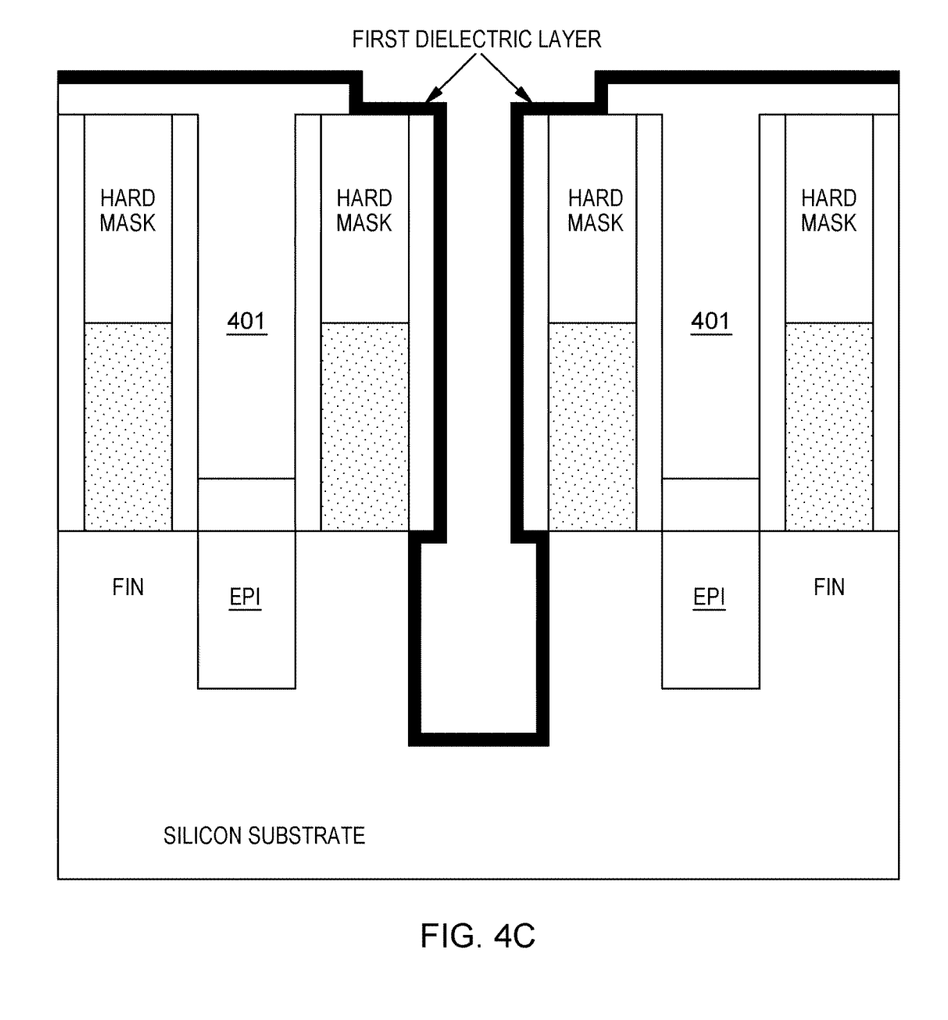

FIG. 4C shows a deposition of a low-temp oxide (i.e., first dielectric liner 220) layer.

Figure 4D:
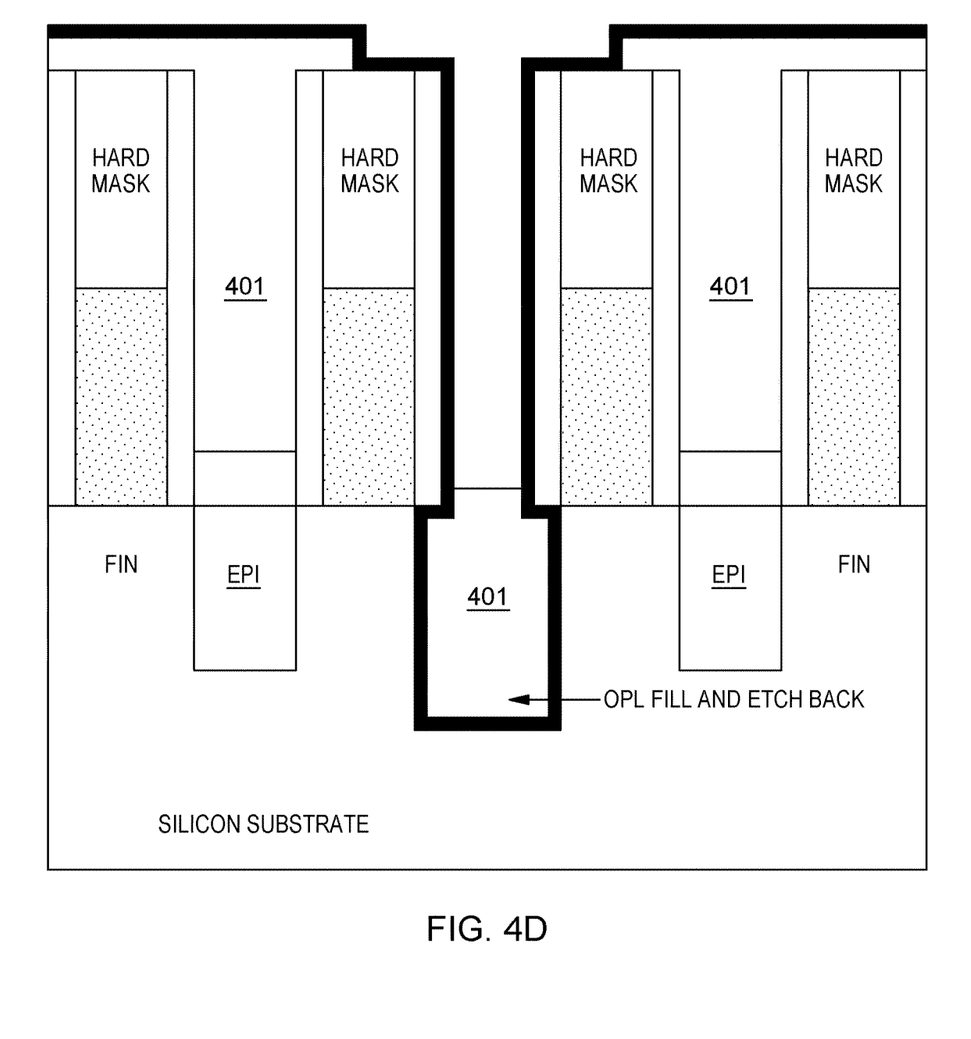

FIG. 4D shows an OPL 401 fill and etch back. The OPL 401 is a sacrificial material to be removed later.

Figure 4E:
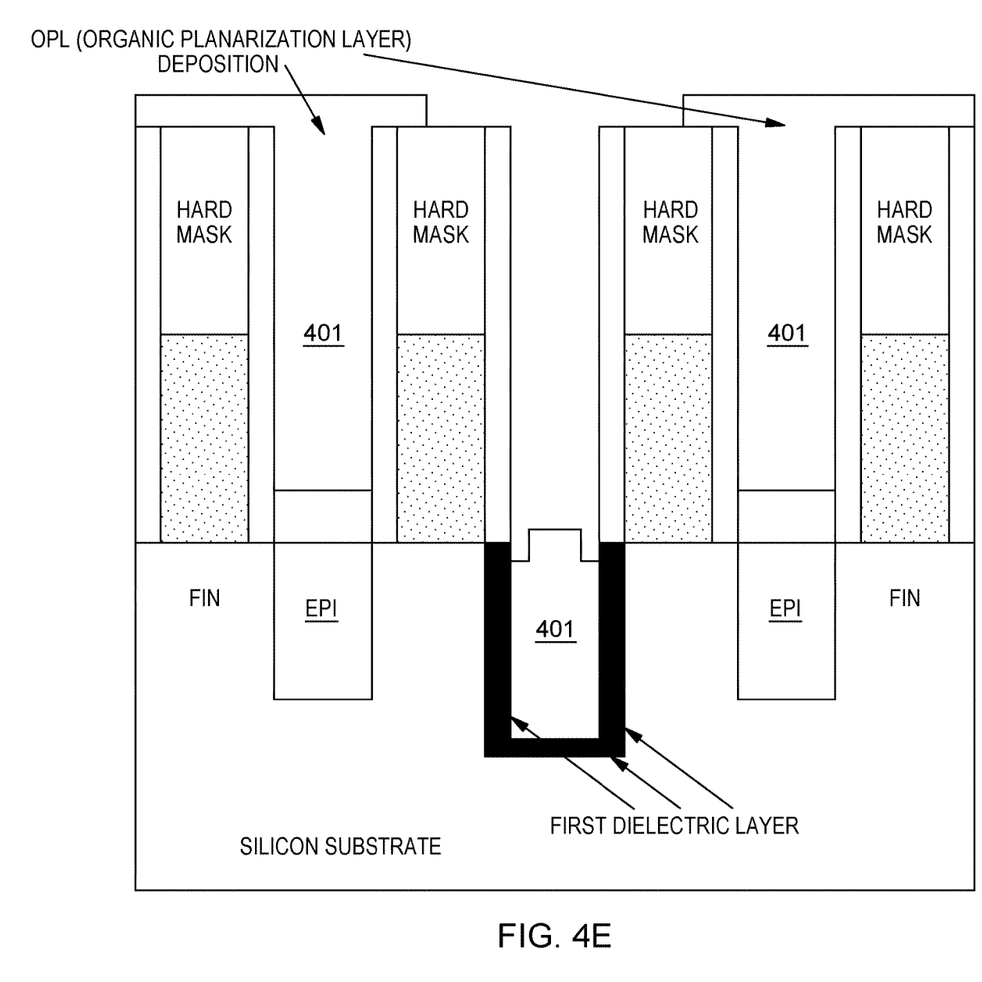
Figure 4F:
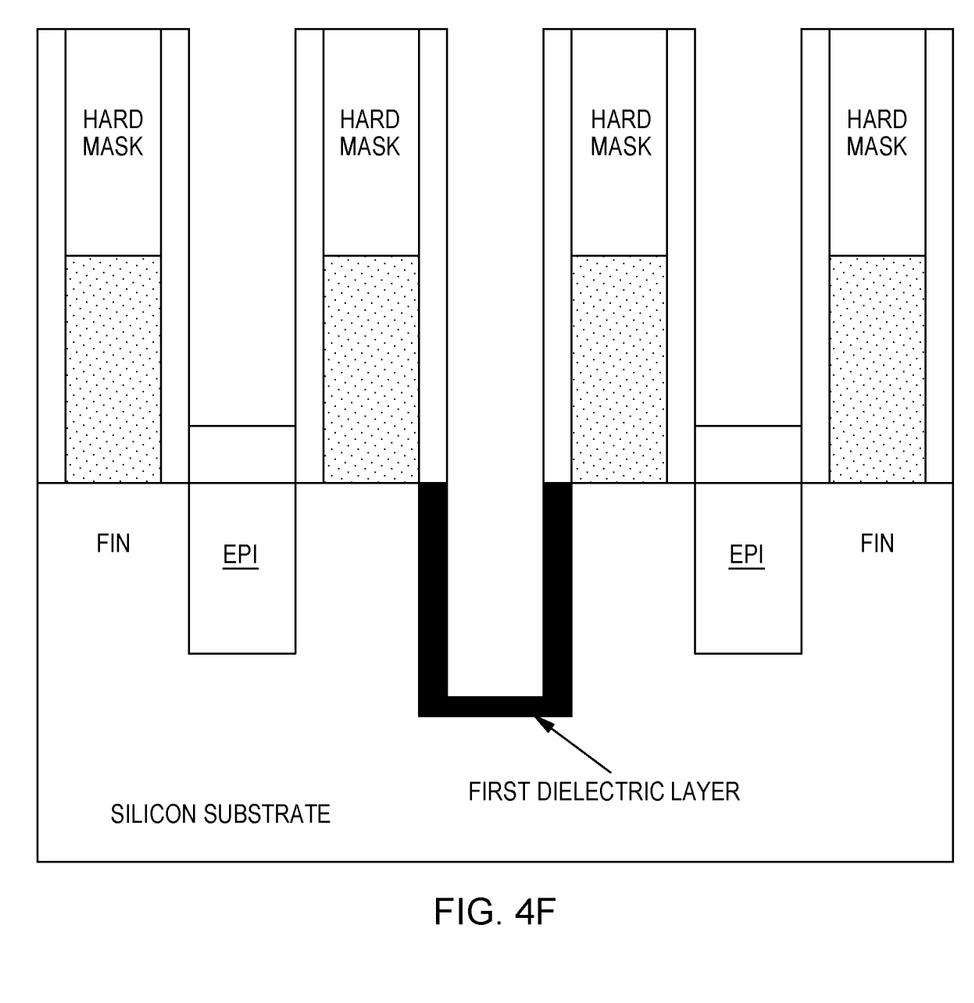

FIG. 4E shows a removal of the exposed low-temp oxide layer (i.e., first dielectric liner 220) from FIG. 4C. FIG. 4F shows after an OPL ash.

Figure 4G:
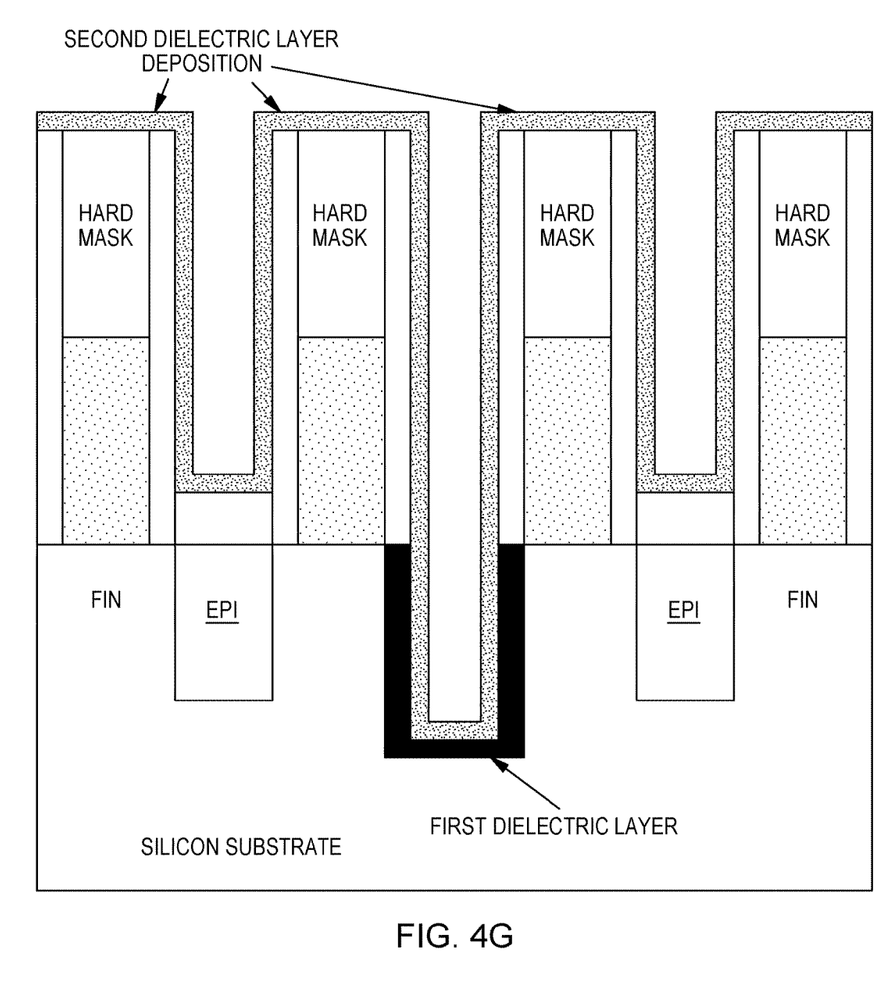

FIG. 4G shows a second dielectric layer deposition. The second dielectric layer (i.e., second dielectric liner 215) can be made using CESL (contact etch stop layer) SiN.

Figure 4H:
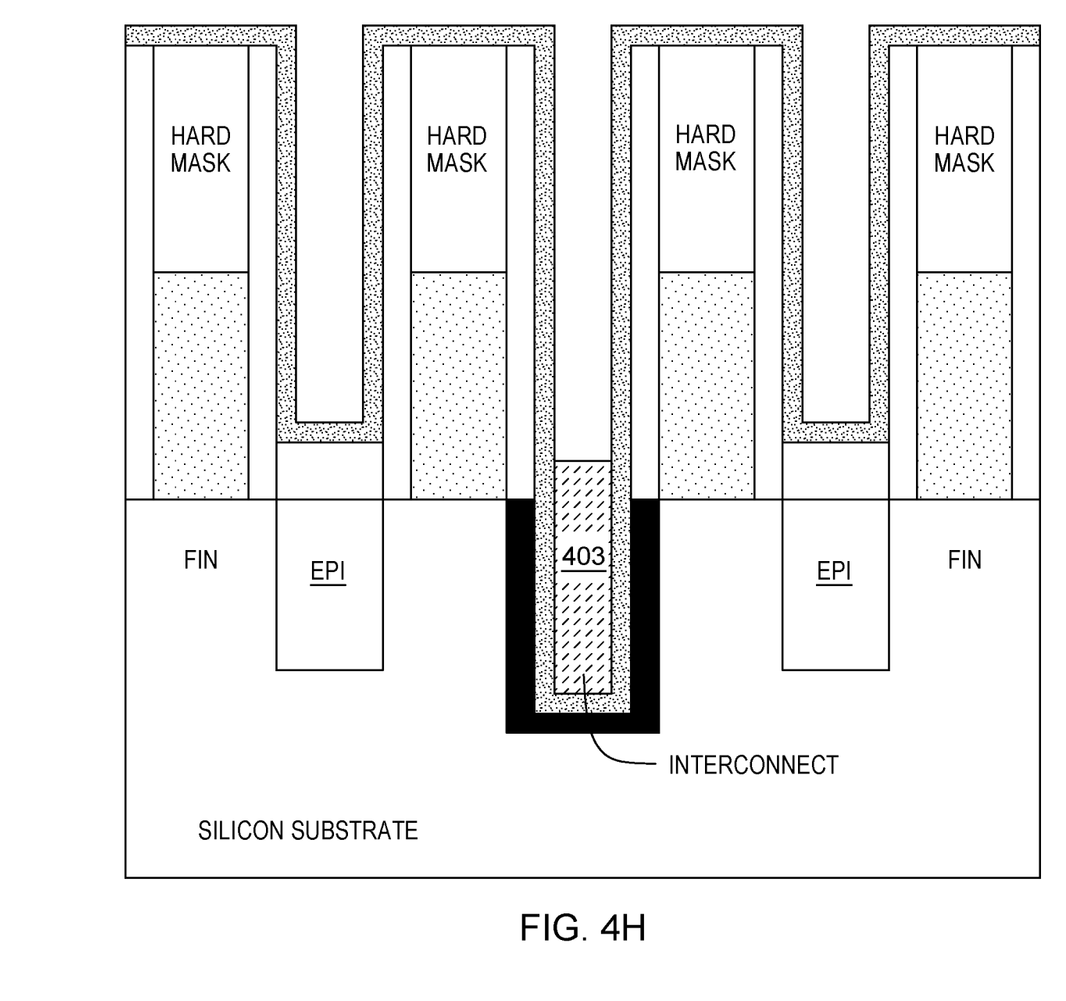

FIG. 4H shows the formation of the recessed local interconnect (i.e., 403) into the cavity. First of all, a thin metal adhesion layer such as TiN liner is deposited, followed by bulk metal material (such as W, Co, Ru, etc.) fill, followed by metal CMP. After metal CMP, a metal recess process is performed, such that all the metal over S/D epi are removed, and only metal remaining is the recessed local interconnect 403 which is located over the double diffusion break cavity.

Figure 4I:
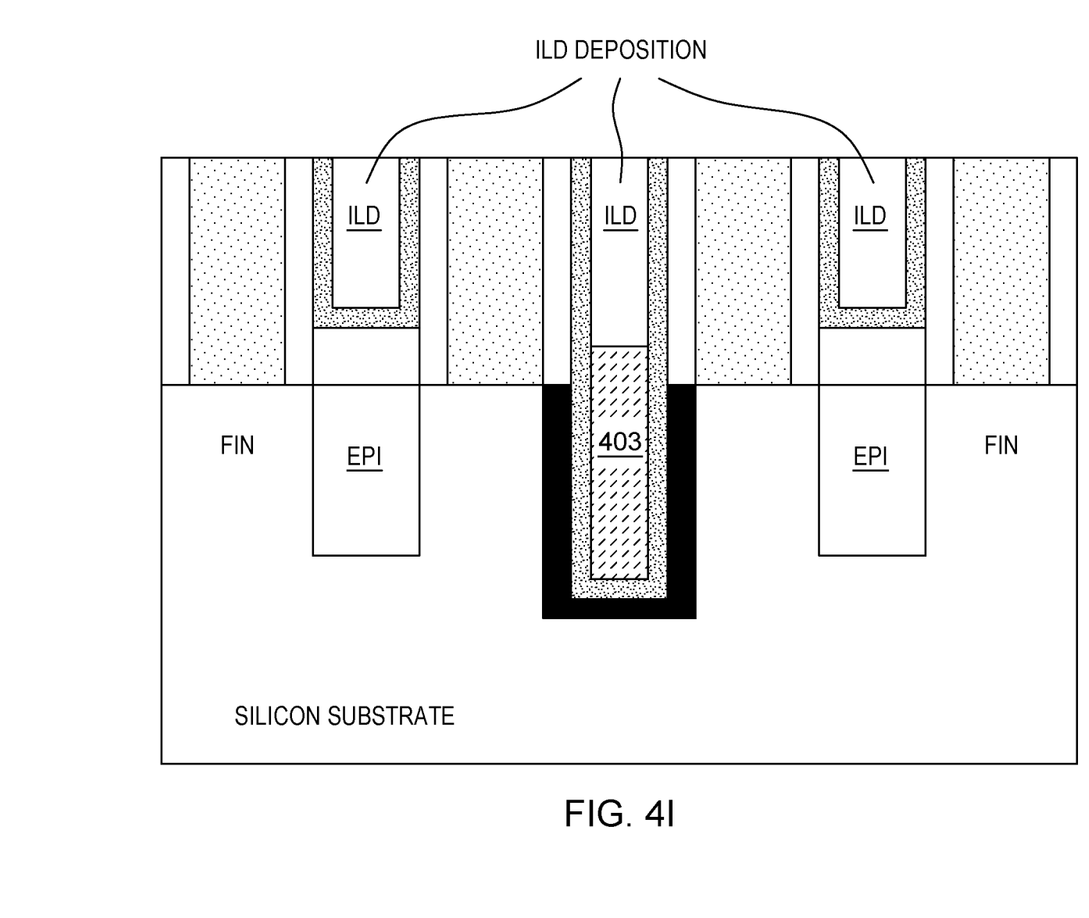

FIG. 4I shows ILD (interlayer dielectric) deposition, followed by a CMP process which stops over the dummy gate. ILD can be made from $SiO_2$. The hard mask is removed during ILD CMP.

Figure 4J:
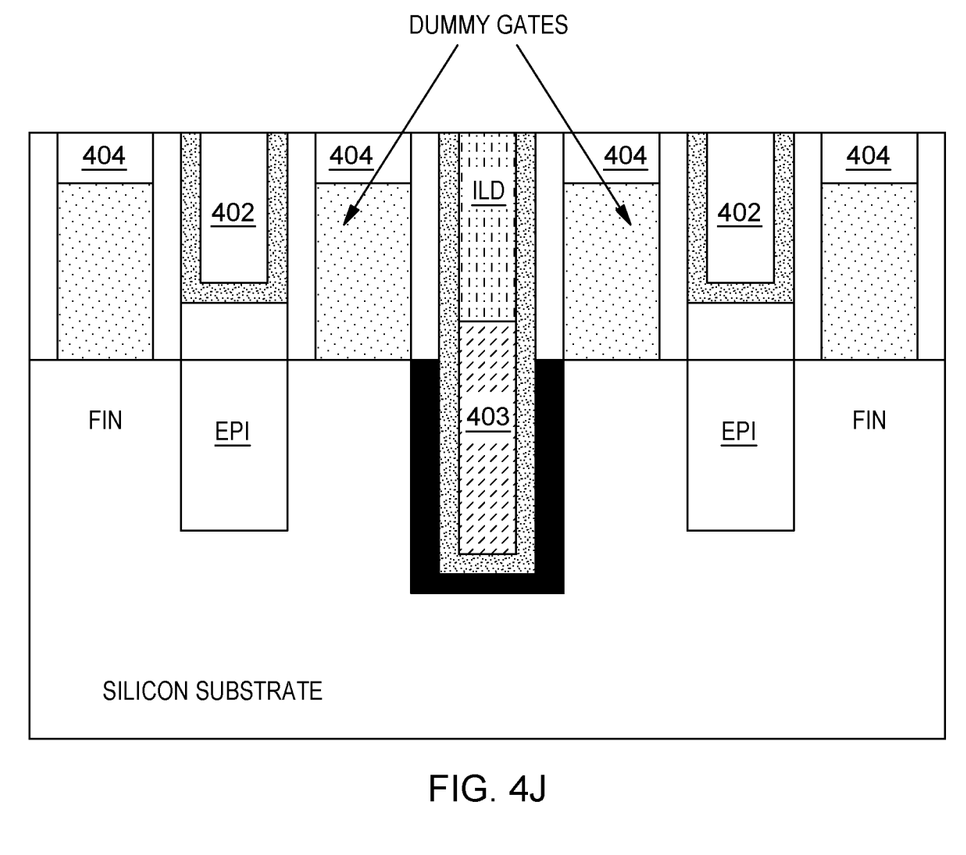

FIG. 4J shows the final structures after RMG (replacement metal gate), adding SAC cap 404 (self-aligned contact gate dielectric cap) and TS 402 (trench silicide contact over source/drain epi) formation. It is noted that, all dummy gates materials are removed, and are replaced with high-k/metal gate stacks.

Figure 5:
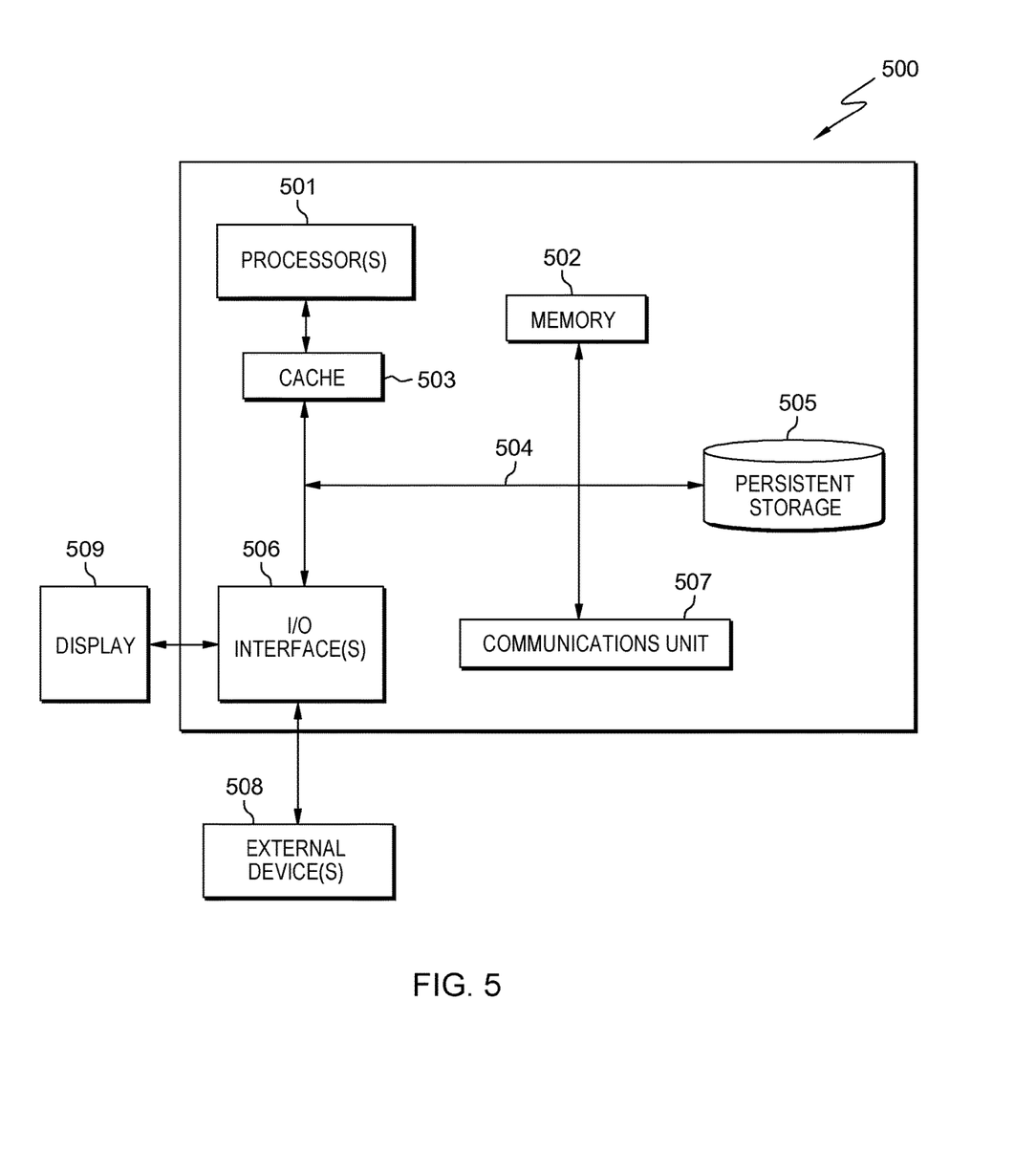
FIG. 5 depicts a block diagram, designated as 500, of components of a server computer capable of executing process 300, in accordance with an embodiment of the present invention.

FIG. 5 includes processor(s) 501, cache 503, memory 502, persistent storage 505, communications unit 507, input/output (I/O) interface(s) 506, and communications fabric 504. Communications fabric 504 provides communications between cache 503, memory 502, persistent storage 505, communications unit 507, and input/output (I/O) interface(s) 506. Communications fabric 504 can be implemented with any architecture designed for passing data and/or control information between processors (such as microprocessors, communications and network processors, etc.), system memory, peripheral devices, and any other hardware components within a system. For example, communications fabric 504 can be implemented with one or more buses or a crossbar switch.

Memory 502 and persistent storage 505 are computer readable storage media. In this embodiment, memory 502 includes random access memory (RAM). In general, memory 502 can include any suitable volatile or non-volatile computer readable storage media. Cache 503 is a fast memory that enhances the performance of processor(s) 501 by holding recently accessed data, and data near recently accessed data, from memory 502.

Program instructions and data (e.g., software and data x10) used to practice embodiments of the present invention may be stored in persistent storage 505 and in memory 502 for execution by one or more of the respective processor(s) 501 via cache 503. In an embodiment, persistent storage 505 includes a magnetic hard disk drive. Alternatively, or in addition to a magnetic hard disk drive, persistent storage 505 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 505 may also be removable. For example, a removable hard drive may be used for persistent storage 505. Other examples include optical and magnetic disks, thumb drives, and smart cards that are inserted into a drive for transfer onto another computer readable storage medium that is also part of persistent storage 505. Process 300 can be stored in persistent storage 505 for access and/or execution by one or more of the respective processor(s) 501 via cache 503.

Communications unit 507, in these examples, provides for communications with other data processing systems or devices. In these examples, communications unit 507 includes one or more network interface cards. Communications unit 507 may provide communications through the use of either or both physical and wireless communications links. Program instructions and data (e.g., process 300) used to practice embodiments of the present invention may be downloaded to persistent storage 505 through communications unit 507.

I/O interface(s) 506 allows for input and output of data with other devices that may be connected to each computer system. For example, I/O interface(s) 506 may provide a connection to external device(s) 508, such as a keyboard, a keypad, a touch screen, and/or some other suitable input device. External device(s) 508 can also include portable computer readable storage media, such as, for example, thumb drives, portable optical or magnetic disks, and memory cards. Program instructions and data (e.g., process 300) used to practice embodiments of the present invention can be stored on such portable computer readable storage media and can be loaded onto persistent storage 505 via I/O interface(s) 506. I/O interface(s) 506 also connect to display 509.

Display 509 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device, the semiconductor device comprising:
    a substrate comprising one or more gates, one or more gate spacers and one or more s/d (source/drain) epis;
    a double diffusion break located between a first gate and a second of the one or more gates on the substrate;
    a plurality of dielectric liners disposed at a bottom portion of the double diffusion break, wherein the plurality of dielectric liners further comprises, a first dielectric liner and a second dielectric liner
        and wherein the first dielectric liner further comprises a low temperature oxide material and the second dielectric liner further comprises CESL (contact etch stop layer) SiN material;
    a local interconnect disposed on the plurality of dielectric liner; and
    a dielectric fill material disposed on the local interconnect.

2. The semiconductor device of claim 1, wherein the local interconnect comprises a metal and a thin adhesion liner, wherein the metal has a top surface which is lower than a top surface of the S/D (source/drain) epis.

3. The semiconductor device of claim 1, wherein the local interconnect is capped with interlayer dielectric (ILD).

4. The semiconductor device of claim 1, wherein the local interconnect is made from metal chosen from a group of materials comprising of W, Ru, or Co.

5. The semiconductor device of claim 2, wherein the thin adhesion liner is made from a group of material comprising of TiN or TaN.

6. The semiconductor device of claim 1, wherein the local interconnect is electrically isolated from the substrate with the first dielectric liner and the second dielectric liner.

7. The semiconductor device of claim 1, wherein the first dielectric liner is formed directly over a cavity of the substrate, and a first end the first dielectric liner and a second end of the first dielectric liner are recessed below the one or more gate spacers.

8. The semiconductor device of claim 1, wherein the second dielectric liner is formed over the one or more gate spacers and the first dielectric liner.

* * * * *